Figure 1:
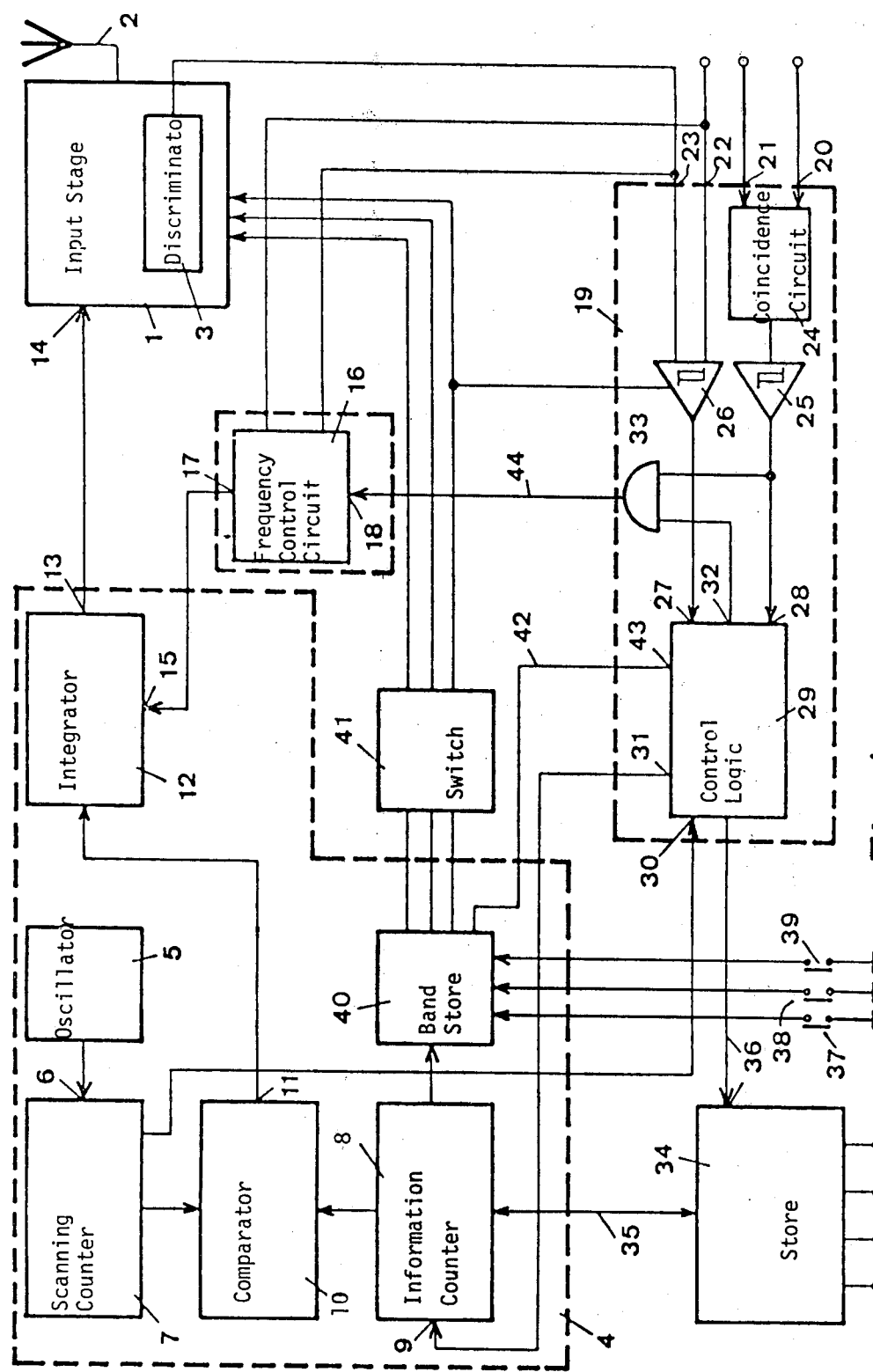

United States Patent [19]
Elshuber et al.

[11] 4,159,487
[45] Jun. 26, 1979

[54] LOW COST MEMORY STATION

[75] Inventors: Karl Elshuber, Kirchdorf; Hans Tonn, Inkofen; László Gotz, Freising, all of Fed. Rep. of Germany

[73] Assignee: Texas Instruments Deutschland GmbH, Freising, Fed. Rep. of Germany

[21] Appl. No.: 720,878

[22] Filed: Sep. 7, 1976

[30] Foreign Application Priority Data

Sep. 16, 1975 [DE] Fed. Rep. of Germany ....... 2541299

[51] Int. Cl.² .......................... H04B 1/34; H04N 5/44
[52] U.S. Cl. .................................... 358/193; 325/421; 325/423; 325/464; 325/470; 358/195
[58] Field of Search ................ 325/418, 420, 421, 422, 325/423, 334, 335, 346, 464, 470; 334/16; 358/191, 193, 195

[56] References Cited

U.S. PATENT DOCUMENTS

| 3,189,829 | 6/1965 | Bento et al. | 325/470 |
|---|---|---|---|
| 3,293,572 | 12/1966 | Smith | 325/471 |
| 3,487,311 | 12/1969 | Luhowy | 325/422 |
| 3,671,870 | 6/1972 | Wellhausen | 325/470 |
| 3,686,574 | 8/1972 | Niman | 325/421 |
| 3,825,838 | 7/1974 | Mayle | 325/470 |
| 3,936,753 | 2/1976 | Clark | 325/420 |
| 4,123,716 | 10/1978 | Borg | 325/470 |

Primary Examiner—Marc E. Bookbinder
Attorney, Agent, or Firm—Mel Sharp; Jim Comfort; Rhys Merrett

[57] ABSTRACT

An automatic TV tuner circuit responsive to a tuning voltage for tuning over a desired frequency reception range. The tuning voltage is generated by a staircase voltage generator. A discriminator produces an output signal having a nominal value when the receiver is tuned to a transmitted broadcast frequency and at a discriminator output having a predetermined difference from the nominal value, a sequence control circuit halts the operation of the staircase generator and regulates the tuning voltage in a continuous manner under control of the discriminator output signal to complete the tuning process.

11 Claims, 2 Drawing Figures

LOW COST MEMORY STATION

The invention relates to a circuit arrangement including a staircase voltage generator, for generating a tuning voltage for tuning a broadcast receiver whose input stage can be tuned through by means of the tuning voltage over a desired reception frequency range and which contains a discriminator whose output signal has a given nominal value when the receiver is tuned to a nominal frequency.

In such a circuit arrangement, it has been suggested to reduce the rate of variation of the output voltage of the staircase voltage generator if the output voltage of the discriminator indicates that the setting of the input stage is approaching tuning to a transmitter radiating a nominal frequency. The rate of variation is finally reduced to zero when the input stage is tuned exactly to the transmitter frequency. As can be readily seen, the steps of the staircase voltage must be very low to ensure exact tuning to any given nominal frequency. Voltage steps that are too high could have the result that the receiver is tuned to a frequency which is still below the nominal frequency, while it becomes tuned to too high a frequency in the next following step. Generating the finely tuned staircase voltage requires relatively high circuit complexity, which is further increased by the fact that the speed at which the individual steps are traversed must be reduced when approaching the tuning to a transmitter radiating the nominal frequency.

The invention is concerned with a circuit arrangement of the indicated type such that the required circuit complexity, and thus the costs may be reduced.

In a preferred embodiment of the invention, a sequence control circuit stops the staircase voltage generator when the value of the output signal of the discriminator has a predetermined difference from the nominal value. A frequency control circuit triggered by the sequence control circuit when the staircase voltage generator is stopped, regulates the voltage produced by the stopped staircase generator in dependence on the discriminator output signal to a value tuning the receiver to the nominal frequency, the control range of the frequency control circuit being at least sufficiently wide that it includes the range between two tuning frequencies attained in successive steps of the staircase voltage.

In such a circuit arrangement embodying the invention, the operation of the staircase voltage generator is stopped when the discriminator output signal indicates the predetermined approach of the tuning to a transmitter radiating the nominal frequency. The tuning voltage generated in the stopped state of the staircase voltage generator can then be so varied by means of a frequency control circuit so that the receiver is finely tuned to the nominal frequency. The control range of the frequency control circuit is sufficiently wide that it includes the range between two tuning frequencies attained in successive steps of the staircase voltage.

The coarse tuning achieved by means of the circuit using the steps of the tuning voltage produced by the staircase voltage generator, and the subsequent fine tuning by means of the similarly acting frequency control circuit have the result that high circuit complexity is no longer required for tuning the receiver. Production costs of a circuit embodying the invention can therefore be reduced.

In an advantageous embodiment of the invention, the staircase voltage generator includes a scanning counter continuously passing through its counting cycle, and an information counter fed from the sequence control circuit with stepping pulses. A comparator compares the counts of the two counters and produces an output voltage as long as the count of the scanning counter is less than the reading of the scanning information counter. The output of the comparator is connected to the input of an integrator which integrates the output voltage of the comparator and and produces the tuning voltage at its output.

Furthermore the count of the information counter, attained when the staircase voltage generator is stopped by the sequence control circuit, can be stored and fed again into the information counter when needed. This has the result that the receiver, by feeding an information counter count stored during its search run into the information counter, can be tuned immediately to this transmitter, without requiring a further search run. This is of particular advantage if a receiver is tuned through in its first operation in a search run over a predetermined frequency range, so that the transmitters located in this range can be determined. The counts of the information counter attained in the reception of these transmitters can be stored, so that the receiver can be tuned subsequently to a desired transmitter by feeding the stored information into the information counter.

For tuning a television receiver, the sequence control circuit embodying the invention is preferably so designed that it enables the frequency control circuit, after the operation of the staircase voltage generator has been stopped, only when there is coincidence between the sync pulses of the received video signal and line flyback pulses of the and that it starts the operation staircase voltage generator again in the absence of coincidence. This ensures that the television receiver is fine-tuned only to true picture transmitters where there is coincidence between the sync pulses and the line flyback pulses.

In circuit arrangement embodying the invention, the coincidence circuit used to determine the coincidence between the sync pulses and the line flyback pulses advantageously may contain a charging transistor which is arranged in the charging circuit of a charging capacitor, and which is conductive only when a sync pulse and a line flyback pulse appear in the coincidence circuit, a predetermined voltage value on the charging capacitor indicating the presence of coincidence.

Figure 2:
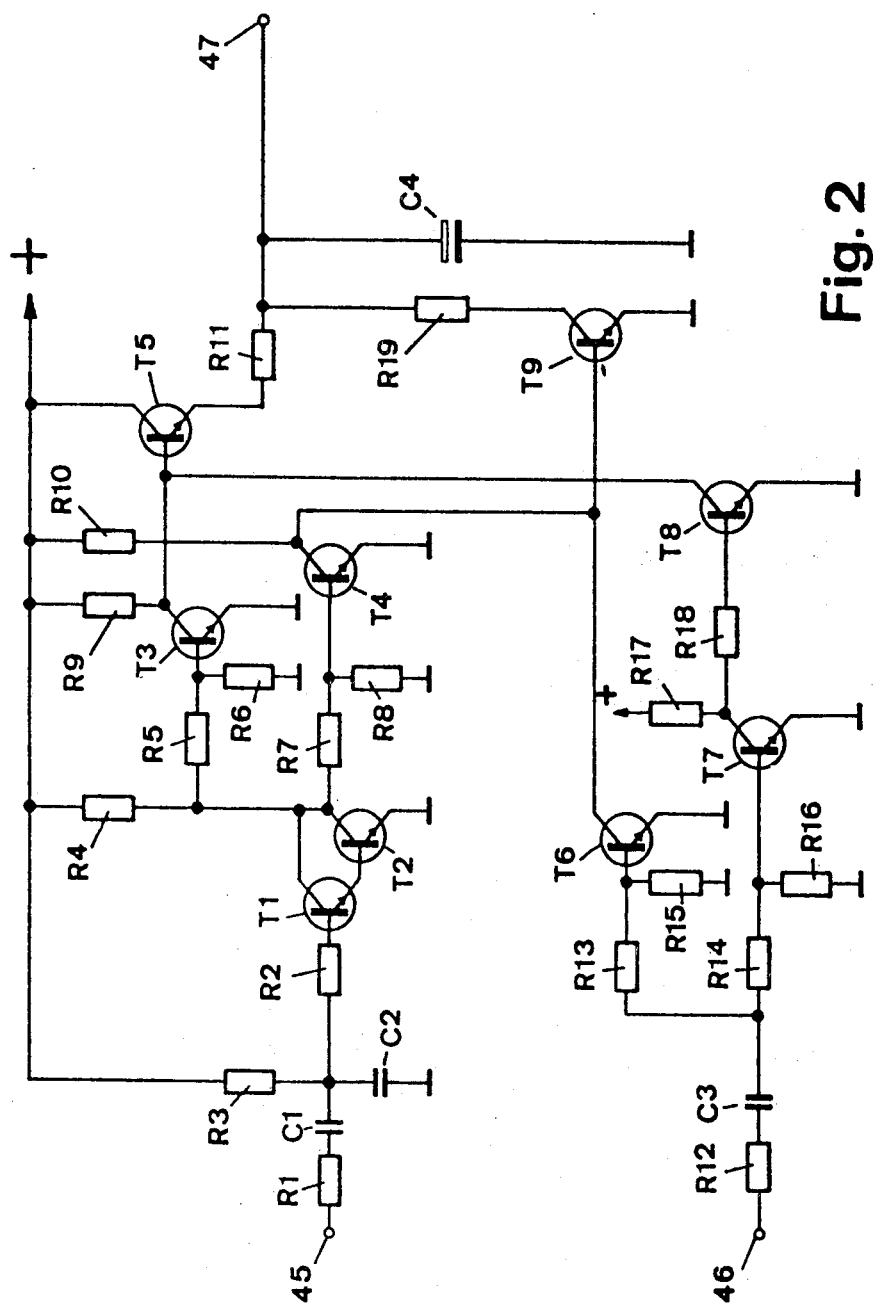

An embodiment of the invention will now be described by way of example and in greater detail to show how the invention may be put into effect, reference being made to the accompanying drawings, in which:

FIG. 1 shows a block circuit diagram of a circuit arrangement embodying the invention, FIG. 2 shows a circuit diagram of the coincidence circuit shown in FIG. 1.

The circuit arrangement illustrated in FIG. 1 serves to tune a television receiver to a nominal transmission frequency. The input stage of this television receiver receives over antenna 2 the RF-signal. This input stage 1 includes a conventional discriminator 3 which produces a signal having a predetermined nominal value when the receiver is tuned to the nominal frequency.

The tuning voltage for input stage 1 is supplied by a staircase voltage generator 4. This staircase voltage generator 4 includes an oscillator 5 which generates continuous output-pulses and feeds them to the stepping input 6 of a scanning counter 7. The scanning counter 7 thus sweeps its counting cycle continuously.

Furthermore, the staircase voltage generator 4 contains an information counter 8 which is operated only when required, as will be described below, and which is supplied at its stepping input 9 with pulses whose recurrence frequency is lower than the output pulses of the oscillator 5.

The counts of the scanning counter 7 and of the information counter 8 can be compared with each other in a comparator 10. This comparator 10 is so designed that it produces an output voltage at its output 11 whenever the count of the scanning counter 7 is lower than that of the information counter 8. The output voltage of the comparator 10 is integrated by an integrator 12 and fed to the input 14 of input stage 1 for tuning purposes. The integrator 12 is so designed that the value of the voltage at its output 13 depends not only on the output voltage of the comparator 10, but also on a signal fed to an input 15.

The signal at input 15 influencing the output voltage of the integrator is supplied by a frequency control circuit 16, generally also called an AFC-circuit, which in known manner produces at its output 17 a control voltage which depends on the difference between the discriminator output voltage and a fixed reference voltage. The frequency control circuit 16 can be gated or made inoperative by a switching signal fed to a gate input 18.

The operating sequence of the circuit arrangement illustrated by FIG. 1 is controlled by a sequence control circuit 19. This sequence control circuit 19 receives at the input 20 line flyback pulses of the television receiver, and its input 21 receives sync pulses from the video amplifier. At the input 22 of the sequence control circuit 19 is applied the reference voltage which is also fed to the frequency control circuit 16. At the input 23 is applied the output voltage from the discriminator 3. The sequence control circuit 19 includes a coincidence circuit 24 which triggers a Schmitt-trigger 25 to produce a coincidence signal indicating coincidence between the sync pulses and the line flyback pulses. Another Schmitt trigger 26 produces an output signal when the discriminator output voltage has a predetermined difference from the reference voltage. The output signals of the two Schmitt triggers 25 and 26 are applied to the inputs 28 and 27 of a control logic 29. This control logic 29 is so designed that it feeds the pulses derived from the scanning counter 7, which are fed to its input 30 and whose recurrence frequency is lower than that of the pulses at the stepping input 6 of the scanning counter 7, over an output 31 to the stepping input 9 of the information counter 8 and interrupts the supply of pulses when a signal from Schmitt trigger 26 appears at input 27, and the coincidence signal of Schmitt trigger 25 indicates the presence of coincidence between the line flyback pulses and the sync pulses. The supply of pulses to the stepping input 9 of the counter 8 is resumed, however, if the presence of coincidence is not indicated within a period required for checking the coincidence, by producing the coincidence signal on Schmitt trigger 25 after the pulse supply has been interrupted. But if coincidence is indicated, the control logic 29 generates at output 32 a signal which has the effect that the switching signal is applied together with the coincidence signal over an AND-circuit 33 to the enable input 18 of the frequency control circuit 16.

The counter reading attained when the supply of stepping pulses is interrupted to the input 9 of the information counter 8 can be stored in a store 34. The storage position can be selected by means of addressing inputs A, B, C, and D. This store also permits feeding of a previously stored counter reading into the information counter 8. The transmission path for the exchange of information between the information counter 8 and the store 34 is indicated schematically by the line 35. The control signals for carrying out the exchange of information are supplied over the line 36 by the control logic 29.

The manner of operation of the circuit arrangement represented in FIG. 1 is as follows. The circuit arrangement is to be used to tune the television broadcast receiver to a frequency radiated from a television transmitter. Input stages of television receivers are initially set to a certain frequency range before actual tuning to the nominal frequency within the set range. To this end the circuit arrangement represented in FIG. 1 includes three trip switches 37, 38, and 39, which, when tripped, set the input stage to the VHF-I range, the VHF-III range and the UHF range respectively. Assuming that the desired nominal frequency to which the receiver is to be tuned is in the VHF-I range, trip switch 37 is actuated. This has the result that information characterizing this range is fed into the band store 40 which effects the switching of input stage 1 to the desired range. Together with the switching, a trigger signal is applied over line 42 from band store 40 to input 43 of control logic 29, so that the latter is put into operation.

As mentioned above, the control logic 29 receives at input 30 pulses which are derived from the continuously recirculating scanning counter 7 and whose repetition frequency is lower than the repetition frequency of the stepping pulses of this counter, which are supplied by oscillator 5. The pulses at input 30 of control logic 29 are fed to the stepping input 9 of information counter 8 from band store 40, after they have been triggered by means of the signal at input 43. The count of this information counter 8 is therefore increased in synchronism with the pulses at the stepping input 9.

The counts of the scanning counter 7 and of the information counter 8 are compared continuously with each other by the comparator 10. As long as the count of the scanning counter 7 is less than the count of the information counter 8, comparator 10 produces at its output 11 an output signal with a high voltage value. If the count of the scanning counter 7 is greater than that of the information counter 8, the output signal of comparator 10 assumes the voltage value zero.

In the comparison of the readings of the continuously recirculating scanning counter 7 with that of the information counter 8 running at a lower stepping frequency, pulses appear at output 11 of comparator 10 whose duration increases with an increase of the count of the information counter 8. If we assume, for example, that the count of the information counter 8 has a low value, then the time interval in which the count of the scanning counter 7 is less than that of the information counter 8 is short. For this short time, a signal with a high voltage value is given off at output 11 of comparator 10. If the information counter 8 has a higher count, it takes longer until identity between counts of the two counters is achieved and, thus, until the signal at the comparator output 11 assumes the voltage value 0. The longest time for the high voltage produced at output 11 of comparator 10 is when the information counter 8 has attained its highest reading. The pulses produced by comparator 10 thus increase in duration with increasing count of the information counter 8.

The output pulses of comparator 10 are integrated by integrator 12, so that the latter produces at output 13 a voltage rising in steps. This rising voltage arrives as tuning voltage at the input 14 of the input stage 1, which is tuned through in the range selected by means of trip switch 37.

When a transmitter is received in the course of the tuning, discriminator 3 produces in known manner an output voltage with an S-shaped characteristic whose deviation from a reference value serving as a nominal value indicates how accurately the input stage is tuned to the transmitter frequency being received. Exact tuning has been achieved when there is not deviation anymore.

The output voltage of discriminator 3 is fed to Schmitt trigger 26 in the sequence control circuit 19 to which a reference voltage is applied from input 22 and which produces a control pulse when the discriminator output voltage has a predetermined difference from the applied reference voltage, and thus from the nominal value. The control pulse from Schmitt trigger 26 is fed to input 27 of the control logic 29. The control logic 29 then interrupts the supply of stepping pulses to the stepping input 9 of the information counter 8.

In the coincidence circuit 24 of the sequence control circuit 19, the sync pulses and line flyback pulses are checked for coincidence. The coincidence of these pulses is a criterion that the transmitter received is a picture transmitter, as desired. If coincidence is found, Schmitt trigger 25 triggered by coincidence circuit 24 generates a coincidence signal which is fed to the input 28 of control logic 29 and to one input of the AND-circuit 33.

The control logic 29 has only temporarily interrupted the supply of stepping pulses to the information counter 8 during the reception of a control pulse at input 27, and interruption of this supply is confirmed only when the coincidence signal appears at the input 28 after a delay necessary to check the coincidence. The appearance of the control pulse at input 27 and the delayed appearance of the coincidence signal at input 28 have the effect that the information counter 8 is definitely stopped, and a switching signal is produced at output 32 of the control logic 29. The switching signal at outputs 32 and 36 then arrives at the second input of the AND-circuit 33, which is thus enabled, triggering the frequency control circuit 16 over the line 44 leading to the trigger input 18.

Stopping of the information counter 8 has the result that output pulses of equal pulse duration are produced at the output 11 of comparator 10 with each passage of the counting period of the information counter 8, so that the integrator 12 produces at the output 13 a tuning voltage level which depends on the existing count of the information counter 8. Following stoppage of the information counter 8, triggering of the frequency control circuit 16 permits the turning voltage at the output 13 of the integrator 12 to be varied.

The frequency control circuit 16 can be a conventional frequency control circuit which generates a frequency control voltage at output 17 based on the deviation of the output voltage of discriminator 3 from a reference voltage. This control voltage is fed to the integrator 12 at the input 15; it effects a variation of the tuning voltage produced, so that input stage 1 is finely tuned to the transmitter received.

The control range of the frequency control circuit 16 must be so dimensioned that it comprises the range between two tuning frequencies attained in successive steps of the staircase voltage at the output 13 of the integrator circuit 12. Any value of the tuning voltage between the individual steps of the staircase voltage can thus be attained by means of the frequency control circuit 16, so that exact tuning to any desired nominal frequency is possible.

It can be seen that the tuning of the input stage to the nominal frequency takes place substantially in two steps, namely in a coarse-tuning obtained substantially with digital means, and in subsequent silimar fine-tuning.

The count of the information counter 8, which is obtained by the control logic 29 in the interruption of its step-by-step action, can be stored in a store 34. The desired store position can be selected over the addressing inputs A to D. The storage process is controlled by the control logic 29.

By pressing again on trip switch 37, the above described transmitter search can be continued. When the next transmitter is found, the same processes take place as described above. The count of the information counter 8 attained at the location of the next transmitter can likewise be stored again in store 34.

Since, with the storage of the respective readings of the information counter 8, the information on the respective frequency band contained in band store 40 has also been stored away, not only the stored counter reading arrives in the information counter during the addressing of store 34 for the selection of the respective frequency, but also the band information stored in band store 40. This has the effect that the input stage is set to this frequency range. The reading input of the information counter 8 has the result that the tuning voltage associated with this reading is given off at the output 13 of integrator 12, so that the input stage is coarse-tuned to the desired transmitter. This coarse-tuning thus effects the triggering of the frequency control circuit 16, when it approaches a transmitter, just as in the search run, which then effects the fine tuning to the desired transmitter.

As known, the frequency ranges which can be covered with a certain tuning range, are not equal in the VHF-ranges and in the UHF-ranges. The same variation of the tuning voltage leads in the UHF-range, to a greater variation of the tuning frequency than in the VHF-range. In order to take this fact into account, a switching is effected in Schmitt trigger 26 when trip switch 30 selecting the UHF-range is actuated. This switching has the effect on the control pulse produced by Schmitt trigger 26 that the frequency interval between the nominal frequency and the frequency at which the information counter 8 is stopped, is greater in the UHF-range than in the VHF-range.

FIG. 2 shows an embodiment of the circuit 24 for determining the coincidence between the sync pulses and the line flyback pulses. The video signal is fed to the input 45 and the line flyback signals are applied to the input 46. The sync pulses proper appear at the collectors of the Darlington pair transistors T1 and T2 which together with the input circuit consisting of the resistances R1 and R2 and the capacitors C1 and C2 serve to clip the sync pulses from the video signal. A resistance R3 leads from the connecting points of the capacitors C1 and C2 and of the resistance R2 to the positive terminal of the supply voltage.

The collectors of the transistors T1 and T2 are connected over a resistance R4 with the positive terminal of the supply voltage, and over two base current setting resistances R5, R7 with the base terminals of the transistors T3 and T4. The resistances R6 and R8 serve to shunt charge carriers from the base terminals of the transistors T3 and T4 to ground. Resistances R9 and R10 respectively lead from the collectors of the transistors T3 and T4 to the positive terminal of the supply voltage. Connected to the collector of transistor T3 is the base of a transistor T5 whose collector is connected directly to the positive terminal of the supply voltage and whose emitter is connected by a resistance R11 to the output of the coincidence circuit.

The line flyback pulses are fed from input 46 jointly over a resistance R12 and a capacitor C3 to the base terminals of two transistors T6 and T7 over two base current setting resistances R13 and R14. For shunting charge carriers, resistances R15 and R16 are connected to the base terminals of these transistors. The collector of transistor T7 is connected by a resistance R17 to the positive terminal of the supply voltage. Furthermore this collector is connected by a resistance R18 to the base of a transistor T8 whose emitter is connected to ground and whose collector is connected to the base of transistor T5. The collector of transistor T6 is connected to the collector of transistor T4 and to the base of the transistor T9 whose emitter is connected to ground, and whose collector is connected by a resistance R19 to the output 47 of the coincidence circuit. Between the output 47 and ground is connected a capacitor C4.

When the television receiver is in operation, line flyback pulses are constantly fed to the input 46. These line flyback pulses make the transistors T6 and T7 conductive. Transistor T8 is cut off. In the time periods between the line flyback pulses, transistor T8 is always conductive and transistor T6 is cut off.

As a criterion that the receiver is tuned to a television transmitter, the fact is used that in such a tuning to a television transmitter, the sync pulses transmitted by the latter coincide in time with the line flyback pulses in the television receiver or appear within the line flyback pulses. The presence of coincidence between the line flyback pulses and the sync pulses thus means that the receiver is tuned to a television transmitter.

In the tuning to a television transmitter, the sync pulses clipped by the transistors T1 and T2 from the video signal at the input 45 have the effect that the transistors T3 and T4 are blocked. Since transistor T8 had already been blocked by the line flyback pulses at the input 46, transistor T5 can switch into the conductive state, so that a charging current can flow over transistor T4 to capacitor C4. When the charging voltage at capacitor C4 exceeds the threshold value of Schmitt trigger 25, the latter gives off a control voltage which indicates the coincidence between the sync pulses and the line flyback pulses.

Transistor T9, which in the conductive state provides a discharge circuit for capacitor C4, is always blocked when at least one of the transistors T4 and T6 is conductive. This is naturally the case when there is coincidence, that is, when transistor T5 is conductive and permits the charging of capacitor C4.

In order to prevent that a charging voltage is formed on capacitor C4 by some breakdown in the absence of coincidence, the coincidence circuit of FIG. 2 is so designed that capacitor C4 is discharged in the time periods between line flyback pulses. This is achieved in the following manner: When a noise signal appears in the time interval between two line flyback pulses, which is so great that it simulates a sync pulse, the transistors T3 and T4 are blocked. Transistor T5 becomes thus non-conductive, since it is still held in the cut-off state by the conductive transistor T8. Since transistor T6 is always cut off in the time intervals between line flyback pulses, the cut off state of transistor T4 caused by the noise signal effects switching of transistor T9 into the conductive state. A charging voltage on capacitor C4 can therefore be by-passed by resistor R19 and the collector-emitter junction of transistor T9. Tests have shown that such noise signals appear relatively frequently, so that transistor T9 is switched several times into the conductive state in the periods between line flyback pulses. This prevents a charging voltage from building up on capacitor C4, which could trigger a response of Schmitt trigger 25 connected to output 47.

The same effect, namely the discharge of capacitor C4, is also realized by true sync pulses not simulated by noise signals, which fall into the periods between line flyback pulses. Such sync pulses appear in the non-synchronized state when the video signal received has not yet synchronized the oscillator generating the line flyback pulses.

Summarizing it can thus be said that the sync pulses act as charging pulses in the synchronized state, that is, in the case of coincidence which leads to the charging of capacitor C4, while they act in the non-synchronized state as discharge pulses which enable a discharge circuit for capacitor C4.

What is claimed is:

1. A circuit for generating a tuning voltage for tuning a signal receiver having an input stage tunable over a desired reception frequency range by means of the tuning voltage and which includes discriminator means for producing an output signal having a selected value when the receiver is tuned to a nominal frequency; said circuit including staircase voltage generator means for generating a stepwise increasing tuning voltage for application to said input stage; frequency control circuit means operably connectable to said staircase voltage generator means for adjusting the output voltage of said staircase voltage generator in dependence on said discriminator means output signal in a sense to tune said receiver to said nominal frequency; sequence control circuit means for stopping stepping operation of said staircase voltage generator means when the value of said discriminator output signal has a predetermined difference from said selected value and for effecting said operable connection of said frequency control circuit means when stepping operation of said staircase voltage generator means has been stopped by said sequence control circuit means; and wherein said frequency control circuit means has a control range at least sufficiently wide to include tuning frequencies attained in successive steps of said staircase voltage.

2. A circuit according to claim 1, wherein said staircase voltage generator means includes scanning counter means for continuously sweeping its counting cycle, information counter means fed with stepping pulses by said sequence control circuit means, and comparator means for comparing the counts of said scanning and information counter means to produce an output voltage as long as the count of said scanning counter means is lower than the count of said information counter means, said output pulses having a duration which increases with the count of the information counter means and which remains constant when stepping operation of said staircase voltage generator means has been stopped; and means connecting the output of said comparator means to the input of integrator means for integrating the output voltage of said comparator means to produce said stepwise increasing tuning voltage, said tuning voltage having a level which depends on the existing count of the information counter when stepping operation of said staircase voltage generator means has been stopped.

3. A circuit according to claim 2, further including storage means for storing the count of said information counter means when said staircase voltage generator has been stopped by said sequence control circuit means and for subsequent re-entry of said count into said information counter.

4. In a television broadcast receiver including means responsive to received video signals to produce sync pulses and line flyback pulses, an input stage tunable over a desired reception frequency range by a tuning voltage applied to a tuning input of said input stage; staircase voltage generator means for generating a stepwise increasing voltage for application to said tuning input; and discriminator means for producing an output signal, said output signal having a predetermined value when said receiver is tuned to a nominal broadcast frequency, the improvement characterized by:
- frequency control means connected to receive said discriminator output signal and responsive to enablement for continuously adjusting the output voltage from said staircase voltage generator, said frequency control circuit means having a control range sufficiently wide to include at least the tuning frequencies attained in successive steps of said staircase voltage;
- sequence control circuit means including control logic means for stopping stepping operation of said staircase voltage generator means in response to a selected difference of said discriminator output signal from said predetermined value and, when enabled, for enabling said frequency control circuit means until said discriminator output signal has said predetermined value;
- coincidence circuit means having an output connected to said control logic means and responsive to coincidence between said sync pulses and said line flyback pulses to effect said enablement of said control logic means, and responsive to non-coincidence between said sync pulses and said line flyback pulses to cause said control logic means to restart operation of said staircase voltage generator means.

5. A circuit according to claim 4, wherein said coincidence circuit includes a capacitor chargeable to a predetermined value to indicate presence of said coincidence, and a transistor circuit responsive to coincidence of said sync and line flyback pulses to pass charging current to said capacitor.

6. A circuit according to claim 4, wherein said coincidence circuit includes a capacitor chargeable to a predetermined value to indicate presence of said coincidence, a first transistor for passing charging current to said capacitor, a second transistor shunting a control input of said first transistor and switchable to an off condition in the presence of a sync pulse, and a third transistor shunting said control input of said first transistor and switchable to an off condition in the presence of a line flyback pulse.

7. A circuit according to claim 6, including discharge transistor means connected in parallel with said charging capacitor for switching to a conductive state in response to presence of a sync pulse in the absence of a line flyback pulse.

8. In a television broadcast receiver including means responsive to received video signals to produce sync pulses and line flyback pulses, an input stage tunable over at least one desired reception frequency range by a tuning voltage applied to a tuning input of said input stage;
- staircase voltage generator means for generating a stepwise increasing voltage for application to said tuning input for coarse tuning;
- discriminator means responsive to received signals for producing an output signal, said output signal having a selected value when said receiver is tuned to a nominal broadcast frequency;
- frequency control means responsive to enablement for adjusting the output voltage from said staircase voltage generator in a continuous manner for fine tuning until said discriminator output voltage has said predetermined value, said frequency control means having a control range sufficiently wide to include at least the tuning frequencies attained in successive steps of said staircase voltage;
- gating means having an output connected for enabling said frequency control means, said gating means including a switch input and an enabling input;
- sequence control circuit means including control logic means having a first output connected to apply stepping pulses to said staircase voltage generator and a second output connected to the switch input of said gating means;
- first trigger means responsive to a discriminator output voltage having a predetermined difference from said selected value to input said control logic means for disabling said first output;
- second trigger means for inputting said control logic means to actuate said switching input of said gating means, and to confirm disablement of said first output;
- coincidence circuit means responsive to coincidence of said sync pulses and said line flyback pulses to trigger said second trigger means and to actuate said enabling input of said gating means.

9. A circuit according to claim 8, wherein said staircase voltage generator means includes scanning counter means for continuously sweeping its counting cycle, information counter means, the first output of said control logic means connected for stepping said information counter, compartor means for comparing the counts of said scanning and information counter means to produce an output voltage as long as the count of said scanning counter means is lower than the count of said information counter means, said output pulses having a duration which increases with the count of the information counter means and which remains constant when stepping operation of said staircase voltage generator means has been stopped, and means connecting the output of said comparator means to the input of integrator means for integrating the output voltage of said comparator means to produce said stepwise increasing tuning voltage, said tuning voltage having a level which depends on the existing count of the information counter when stepping operation of said staircase voltage generator means has been stopped; and storage means for storing the count of said information counter means when said staircase voltage generator has been stopped by said sequence control circuit means and for subsequent re-entry of said count into said information counter.

10. A circuit according to claim 8, wherein said coincidence circuit includes a capacitor chargeable to a predetermined value to indicate presence of said coincidence, a first transistor for passing charging current to said capacitor, a second transistor shunting a control input of said first transistor and switchable to an off condition for the duration of a sync pulse, a third transistor shunting said control input of said first transistor and switchable to an off condition for the duration of a line flyback pulse, and discharge transistor means connected in parallel with said charging capacitor for switching to a conductive state in response to presence of a sync pulse in the absence of a line flyback pulse.

11. A circuit according to claim 8, wherein said frequency control means comprises an AFC circuit of said receiver.

* * * * *